United States Patent [19]

Inoue

[11] Patent Number: 5,537,429
[45] Date of Patent: Jul. 16, 1996

[54] ERROR-CORRECTING METHOD AND DECODER USING THE SAME

[75] Inventor: Tohru Inoue, Nagaokakyo, Japan

[73] Assignee: Mitsubishi Denki Kabushiki Kaisha, Tokyo, Japan

[21] Appl. No.: 14,235

[22] Filed: Feb. 5, 1993

[30] Foreign Application Priority Data

Feb. 17, 1992 [JP] Japan .................................. 4-029577
May 19, 1992 [JP] Japan .................................. 4-126051
Aug. 1, 1992 [JP] Japan .................................. 4-225020

[51] Int. Cl.$^6$ ............................................... G06F 11/10
[52] U.S. Cl. ................ 371/37.1; 364/265.2; 364/DIG. 1
[58] Field of Search ............................... 371/37.1, 2.1, 371/39.1, 38.1, 40.1; 364/265, 265.2, 944.5

[56] References Cited

U.S. PATENT DOCUMENTS

| Re. 34,245 | 5/1993 | Matsutani et al. | 371/38.1 |
|---|---|---|---|
| 3,896,416 | 7/1975 | Barrett et al. | |
| 4,498,175 | 2/1985 | Nagumo et al. | 371/37.1 |
| 4,555,784 | 11/1985 | Wood | 371/37.1 |
| 4,564,945 | 1/1986 | Glover et al. | 371/38.1 |
| 4,646,301 | 2/1987 | Okamoto et al. | 371/37.1 |
| 4,653,051 | 3/1987 | Sugimura et al. | 371/37.1 |
| 4,701,923 | 10/1987 | Fukasawa et al. | 371/41 |
| 4,719,628 | 1/1988 | Ozaki et al. | 371/37.1 |
| 4,742,519 | 5/1988 | Abe et al. | 371/38 |
| 4,852,099 | 7/1989 | Ozaki | 371/37.1 |
| 4,899,341 | 2/1990 | Tomimitsu | 371/37.6 |
| 4,958,349 | 9/1990 | Tanner et al. | 371/37.1 |
| 4,975,915 | 12/1990 | Sako et al. | 371/37.4 |
| 5,040,179 | 8/1991 | Chen | 371/37.1 |
| 5,099,482 | 3/1992 | Cameron | 371/37.1 |
| 5,168,509 | 12/1992 | Nakamura et al. | 371/37.5 |
| 5,208,815 | 5/1993 | Kojima | 371/37.1 |

OTHER PUBLICATIONS

Konosu et al., "A Study of Binary Expanded Reed–Solomon Codes" (IT91–42).
Sakakibara et al., "Decoding of Reed–Solomon Codes Based on Decoding Distance Profiles" (1986 National Conference of Japan's Electronic Communications Society).
Wang 'A Fast Algorithm for the Fourier Transform Over Finite Fields and its VLSI Implementation' IEEE 1988 pp. 572–577.
Pedersen 'On The Polynomical Description of Concatenated Codes' IEEE 1988 pp. 162 . 165.
Bit–Level Soft Decision Decoding of Reed–Solomon Codes IEEE 1991 Alexander Vardy et al.

*Primary Examiner*—Robert W. Beausoliel, Jr.
*Assistant Examiner*—Albert Decady

[57] ABSTRACT

In a system in which errors are corrected using a BCH code or a Reed-Solomon code whose operations are defined on $GF(2^m)$, both transmitting and receiving sides are provided with a buffer memory which interleaves data in units of $m \times L(L \geq 1) \times N$, and errors are corrected by the Reed-Solomon code when the BCH code is employed at the transmitting side, and by the BCH code when the Reed-Solomon code is employed at the transmitting side.

24 Claims, 14 Drawing Sheets

Fig. 11

| 0,0 | 0,1 | ... | 0,N-1 |
|---|---|---|---|
| 1,0 | 1,1 | ... | 1,N-1 |
| ... | ... | | ... |
| m,0 | m,1 | ... | m,N-1 |
| m+1,0 | m+1,1 | | |
| ... | ... | | ... |
| 2m,0 | 2m,1 | | |
| ... | ... | | ... |
| mxL,0 | mxL,1 | ... | mxL,N-1 |

ERROR-CORRECTING METHOD AND DECODER USING THE SAME

BACKGROUND OF THE INVENTION

1. Field of the Invention

The present invention relates to an error-correcting method and a decoder using the same.

2. Description of Related Art

FIG. 1 is a hardware block diagram of a prior art decoder. In the diagram, the reference numeral 1 designates a memory, 2 an address/data/control signal bus, 3 a Reed-Solomon decoder for a Reed-Solomon code, and 4 a control circuit. Description is given below by taking an (N, K, D) Reed-Solomon code on a Galois field $GF(2^8)$ as an example, where N denotes the code length, K denotes the number of information symbols, and D (D=N−K+1) denotes the minimum distance of the code. In this example, each symbol consists of 8 bits.

The generator polynomial for the Reed-Solomon code is;

$$G(x) = (X-\alpha^i)(X-\alpha^{i+1}) \ldots (X-\alpha^{i+D-2})$$

where $\alpha$ is a primitive element in the Galois field GF(2), and i is an arbitrary integer, usually 0 or 1. Received word data $D_0, D_1, \ldots, D_{N-1}$ recovered from the transmitted codewords are stored at addresses $\#A_0, \#A_1, \ldots, \#A_{N-1}$ in the memory 1 respectively. According to instructions from the control circuit 4, data $D_0, D_1, \ldots, D_{N-1}$ are transferred via the address/data/control signal bus 2 to the Reed-Solomon decoder 3, which corrects up to $t \leq [(D-1)/2]$ errors caused during transmission through a transmission channel. Here, [x] is a Gaussian symbol denoting the largest integer under x. Detailed descriptions of control signals, timing, etc. are omitted here.

At a recent research meeting of Japan's Electronic Information Communications Society, a paper entitled "A Study on Binary Expanded Reed-Solomon codes" (IT91-42, hereinafter referred to as the prior art paper) was presented by Toshiyuki Konosu, Toshimitsu Kaneko, Toshinao Nishijima, Shigeichi Hirasawa, and others, in which they introduced a technique of expanding Reed-Solomon codes to binary BCH codes to increase the burst error correcting capability of the Reed-Solomon codes. The outline of the technique will now be described below.

Parameters are defined as follows

N: Code length of a Reed-Solomon code ($N \leq 2^m - 1$)

K: Number of information symbols in the Reed-Solomon code

D: Minimum distance (D=N−K+1) of the Reed-Solomon code on $GF(2^m)$ $\alpha$: Primitive element on $GF(2^m)$ $m_S(x)$: Irreducible polynomial of $\alpha^S$ on GF(2)

G(x): Generator polynomial of the Reed-Solomon code

With these, the following sets are defined.

$$Z_n = \{0, 1, \ldots, N-1\}$$

$$R_t = \{i | m_0 \leq i \leq m_0 + N - K - 1; i \in Z_n\}$$

$$C_s = \{i | i = 2^p S \in R_t, 0 \leq p \leq m-1\}$$

Cs is a cycle set on GF(2) for $\alpha^S$. Cs* is expressed by the following equation.

$$C_s^* = \{i | i \in (\{\overline{C_s}\} \cap Z_n)\}$$

Using the generator polynomial $m_S(x)$ of the (N, K, N−K+1) Reed-Solomon code on $GF(2^m)$, G(x) can be expressed by the following equation.

$$G(x) = \prod_{i=m_0}^{m_0+N-K-1} (X+\alpha^i) = \prod_{C_s} m_s(x) \prod_{i \in (C_s^* \cap R_t)} (X+\alpha^i)$$

In this case, a codeword C(x) for the Reed-Solomon code is expressed as;

$$C(x) = \sum_{i=0}^{N-1} \left( \sum_{p=0}^{m-1} C_{i,p}^b \cdot \beta_p \right) Z_i \quad (A)$$

$$= \sum_{p=0}^{m-1} \left( \sum_{i=0}^{N-1} C_{i,p}^b \cdot Z_i \right) \beta_p$$

Here, if the following equation (B) in the above equation (A) is regarded as a binary code of length N, it represents the BCH code generated by the following equation (C).

$$\sum_{i=0}^{N-1} (C_{i,p}^b \cdot Z_i) \quad (B)$$

$$g^b(x) = \prod_{C_s} m_s(x) \quad (C)$$

The prior art paper discloses a decoding method whereby solid burst errors of burst length of $m(t-1)+1 \leq b \leq mt$ are corrected using a t-error correcting Reed-Solomon code on $GF(2^m)$. FIG. 2 is a flowchart illustrating the prior art method of increasing the burst error correction capability of the Reed-Solomon code by translating Reed-Solomon code into binary BCH codewords when decoding. First, in step S1, Reed-Solomon decoding on $GF(2^m)$ is performed to determine whether or not the number of errors is t or less. If the number of errors is t or less, error correction is performed and the positions and values of the errors are obtained. The process then proceeds to step S2. If it is decided that the number of errors is t+1 or greater, the process proceeds to step S3. In step S2, the errors are corrected in accordance with a known decoding method. On the other hand, in step S3, the irreducible polynomial m(x) is binary expanded. Next, in step S4, syndrome computation is performed on the m BCH codewords, and in step S5, the computed syndrome values are compared with predetermined syndrome patterns. If there is a syndrome matching the syndrome pattern, a table lookup is performed, using a ROM or the like, to find the error pattern corresponding to the syndrome for correction of the error in step S6. If there is no syndrome matching the syndrome pattern, error correction is not performed, but an error detection flag is set up in step S7.

In the prior art paper, the above operation is shown numerically. First, consider a (15, 2, 14) Reed-Solomon code for which generator polynomial on $GF(2^4)$ is $$g(y) = \prod_{i=1}^{13} (y + \alpha^i)$$

where $\alpha$ is a primitive element in $GF(2^4)$. Let the transmitted word be (0 0 0 0 0 0 0 0 0 0 0 0 0 0 0)

Using the irreducible polynomial on $GF(2^4)$ $$m_1(x) = X^4 + X + 1$$

the transmitted word is binary expanded to yield four BCH codewords of 15 in length for which generator polynomial is $$g^b(x) = m_1(x)m_3(x)$$
$$= (X^4+X+1)(X^4+X^3+X^2+X+1)$$

This represents a (15, 2, 5) BCH code, which is a subcode of a (15, 7, 5) BCH code. $\alpha$, $\alpha^2$, $\alpha^4$, $\alpha^8$, $\alpha^3$, $\alpha^6$, $\alpha^{12}$, and $\alpha^9$ are the roots. When a received word on $GF(2^4)$ is (0 0 0 0 1 $\alpha^{12}\alpha^{12}\alpha^{12}\alpha^{12}\alpha^6$ $\alpha$0 0 0 0)

this means the presence of a solid burst of length of $b=23(m(t-1)+1<b\leq mt)$. Division for each basis gives $\alpha^3$:(0 0 0 0 0 1 1 1 1 1 0 0 0 0)

$\alpha^2$:(0 0 0 0 0 1 1 1 1 1 0 0 0 0)

$\alpha$:(0 0 0 0 0 1 1 1 1 1 0 0 0 0 0)     (D)

1:(000011111100000)

Thus, $g^b(x)$ has $\alpha$ and $\alpha^3$ as independent roots. When the burst length b'=6 or 5, the syndrome is given by
(1) For b'=6
$S_{1,i}=\alpha^{i+9}$
$S_{3,i}=\alpha^{3i}$
(2) For b'=5
$S_{1,i}=\alpha^{i+6}$
$S_{3,i}=0$
Here, i denotes the burst start bit position counted from the last bit position as O bit in the received binary sequence. From equation (D), the followings are obtained;

$\beta_3 = \alpha^3$    $\alpha^{13} = \alpha^{i+9}$
           $\alpha^{12} = \alpha^{3i}$
whence, b' = 6, i = 4

$\beta_2 = \alpha^2$    $\alpha^{13} = \alpha^{i+9}$
           $\alpha^{12} = \alpha^{3i}$
whence, b' = 6, i = 4

$\beta_1 = \alpha$    $\alpha^{11} = \alpha^{i+6}$
$0 = 0$
whence, b' = 5, i = 5

$\beta_0 = 1$    $\alpha^{14} = \alpha^{i+9}$
           $\alpha = \alpha^{3i}$
whence, b' = 6, i = 5

Thus, error correction can be accomplished.

In "A Study on Reed-Solomon Code Decoding Utilizing Bit Minimum Distance" by Katsumi Sakakibara, Kinichiro Tokiwa, and Masao Kasahara (Japan's Electronic Information Communications Society, Technical Research Report IT86-28), another prior art is disclosed as a decoding technique whereby an (n, 2, n-1) Reed-Solomon code is decoded as an (mn, 2 m, (n-1) $2^m$) binary linear code. However, this technique is not really practical as it allows only 2 m information symbol bits and the encoding efficiency is as low as 2/n. Another paper "Decoding of Reed-Solomon Codes Based on Decoding Distance Profiles" by Katsumi Sakakibara, Kinichiro Tokiwa, Masao Kasahara, and Toshihiko Namekawa (1986 National Conference of Japan's Electronic Communications Society, 1407, pp.6–49), disclosed a method whereby a Reed-Solomon code of minimum distance of 4 is binary expanded and decoded as a SEC-DED code. Application of this method, however, is limited to Reed-Solomon codes of minimum distance of 4, and furthermore, this method requires classifying error patterns and solving many congruence equations.

FIG. 3 is a diagram showing eight random errors occurring in a Reed-Solomon code on $GF(2^4)$. Reference numeral 5 designates the error bits. In this case, the eight random errors cause eight symbol errors, the correction of which would require for the Reed-Solomon code to have the minimum distance of D=2t+1=17. Since this would require 16 redundant symbols, exceeding the codeword length of 15, construction of such a code would not be possible.

SUMMARY OF THE INVENTION

The present invention is intended to overcome the above-described problem that random errors cannot be corrected when they are spread to cause as symbol errors.

In a system for transmitting data using a Reed-Solomon code, even a single bit error in one symbol will lead to a symbol error, and therefore, if m in a Galois field $GF(2^m)$ is relatively large, random bit errors will increase symbol bit errors and thereby, the error-correcting capability of the Reed-Solomon code will be decreased. It is an object of the present invention to provide an error-correcting method and a decoder using the same, wherein a Reed-Solomon code is decoded as a binary BCH code, thereby achieving efficient correction of random errors that have been spread out over symbols.

It is another object of the invention to provide an error-correcting method wherein, in a system for transmitting data using a BCH code, data are interleaved so that when the required error correcting performance cannot be achieved, received BCH codewords are decoded as Reed-Solomon codes, thereby increasing the error-correcting efficiency.

According to an error-correcting method in a first preferred mode of the invention, data are arranged in an m×N array in a memory, and m received BCH codewords each having N bits and one Reed-Solomon codes having N symbols are decoded. In this preferred mode, since random errors are corrected as binary BCH codes, there is no possibility of the random errors leading to increasing symbol errors nor does the error-correcting capability of the Reed-Solomon code decrease. The resulting effect is an increased error-correcting efficiency.

According to an error-correcting method in a second preferred mode of the invention, data are read out in blocks of m bits from a memory, and the data thus read out are output bit by bit in parallel to decode the respective received BCH codewords. In this preferred mode, as in the first preferred mode, BCH decoding is performed on received Reed-Solomon codewords, and therefore, an excellent error-correcting efficiency can be achieved.

According to a third preferred mode of the invention, a decoder has a converting means for performing basis conversion whereby a result of a division on GF(2) for decoding of a BCH code is converted to a pattern of $GF(2^m)$. In this preferred mode, decoding of a BCH code is made possible as a result of the basis conversion by the converting means.

According to a fourth preferred mode of the invention, a decoder has FIFO memories for storing m bits of data sequentially supplied in parallel. In this preferred mode, received BCH codewords are stored in the respective m FIFO memories and the outputs of these FIFO memories are switched accordingly. Therefore, only one BCH decoding means is needed to serve the purpose.

According to a fifth preferred mode of the invention, a decoder has a Reed-Solomon decoding means and a BCH decoding means both performing operations on GF($2^m$) defined by the same Galois field. In this preferred mode, BCH decoding and Reed-Solomon decoding are performed on the BCH code and Reed-Solomon code defined by the same Galois field.

In a decoder according to a sixth preferred mode of the invention, a computing section for computing error positions is shared by a Reed-Solomon code decoding means and a BCH code decoding means, both means being operated on the same Galois field GF($2^m$). In this preferred mode, since the computing section for computing error positions is shared by the two decoders, the circuit configuration can be simplified.

According to a seventh preferred mode of the invention, a decoder is constructed so that a received codeword of an (N, K, D) Reed-Solomon code having m-bit symbols, is first decoded as m BCH codewords and then decoded as a Reed-Solomon code. In this preferred mode, BCH decoding and Reed-Solomon decoding are combined to achieve an increased error-correcting efficiency.

In an error-correcting method according to an eighth preferred mode of the invention, m received codewords of a BCH code are stored in a memory forming an m×N array and decoded as a Reed-Solomon code on GF($2^m$). In this preferred mode, this memory configuration makes it possible to decode the received BCH codewords as a Reed-Solomon code.

In an error-correcting method according to a ninth preferred mode of the invention, BCH encoded codewords are interleaved in integral multiples of m at the transmitting side, and then transmitted to the receiving side where the received data are decoded in blocks of m as Reed-Solomon codes. In this preferred mode, when applied to a system for transmitting codewords of a BCH code, every m received BCH codewords one received codeword as Reed-Solomon code so that errors can be corrected.

In an error-correcting method according to a 10th preferred mode of the invention, BCH encoded codewords are interleaved in integral multiples of m for decoding as Reed-Solomon codewords which are further decoded as BCH codewords for correction of errors. In this preferred mode, every m BCH codewords are decoded as one Reed-Solomon codeword for correction of errors, and when there are uncorrectable errors, the Reed-Solomon codeword is further decoded as BCH codewords for correction of the errors. This configuration serves to increase the error-correcting efficiency.

In an error-correcting method according to an 11th preferred mode of the invention, BCH encoded codewords are interleaved in integral multiples of m for decoding as BCH codewords which are further decoded as Reed-Solomon codewords for correction of errors. In this preferred mode, m BCH codewords are decoded as BCH codewords for correction of errors, and when there are uncorrectable errors, then the codewords are decoded as a Reed-Solomon codeword. This configuration serves to increase the error-correcting efficiency.

The above and further objects and features of the invention will more fully be apparent from the following detailed description with accompanying drawings.

BRIEF DESCRIPTION OF THE DRAWINGS

FIG. 11 is a diagram showing an example of data stored in a third and a fourth interleaver memory in FIG. 9.

DESCRIPTION OF THE PREFERRED EMBODIMENTS

Preferred embodiments of the present invention will now be described below with reference to the accompanying drawings.

Figure 1:
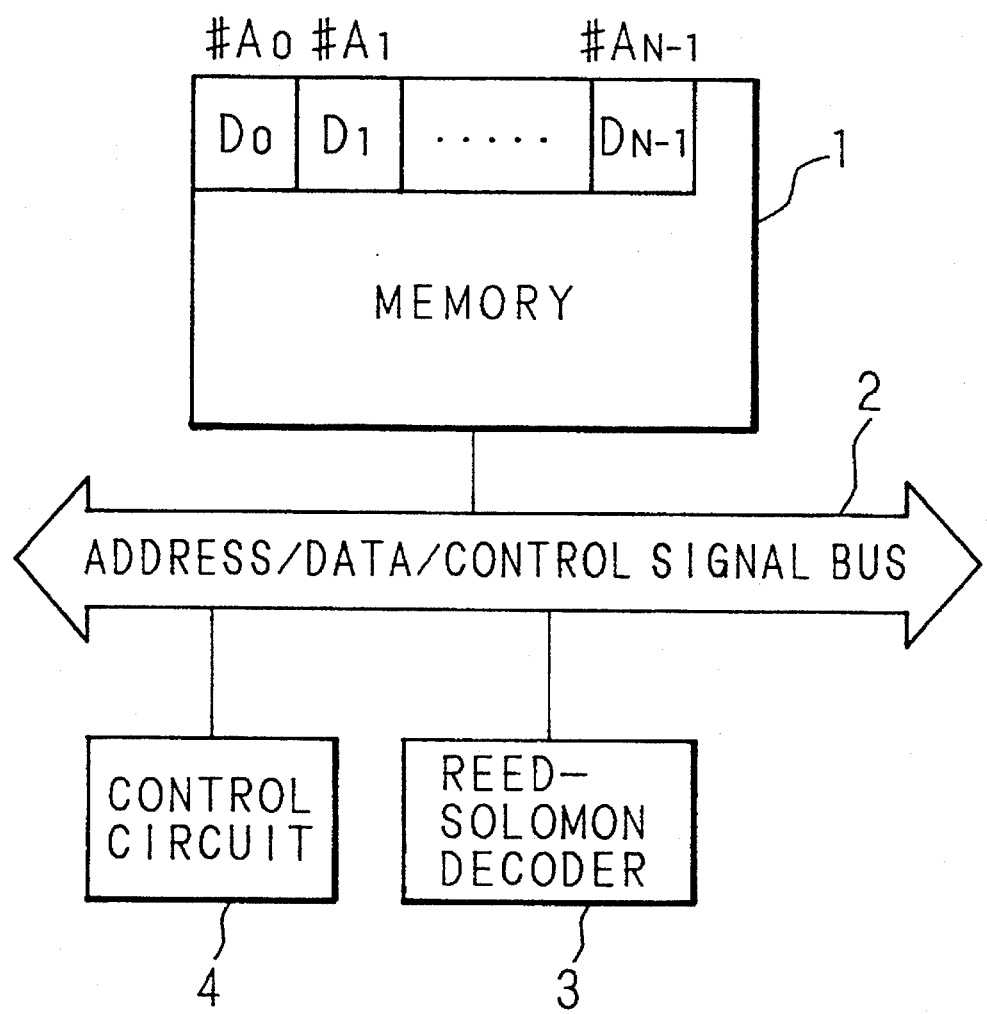
FIG. 1 is a circuit block diagram of a prior art Reed-Solomon code decoder.
Figure 2:
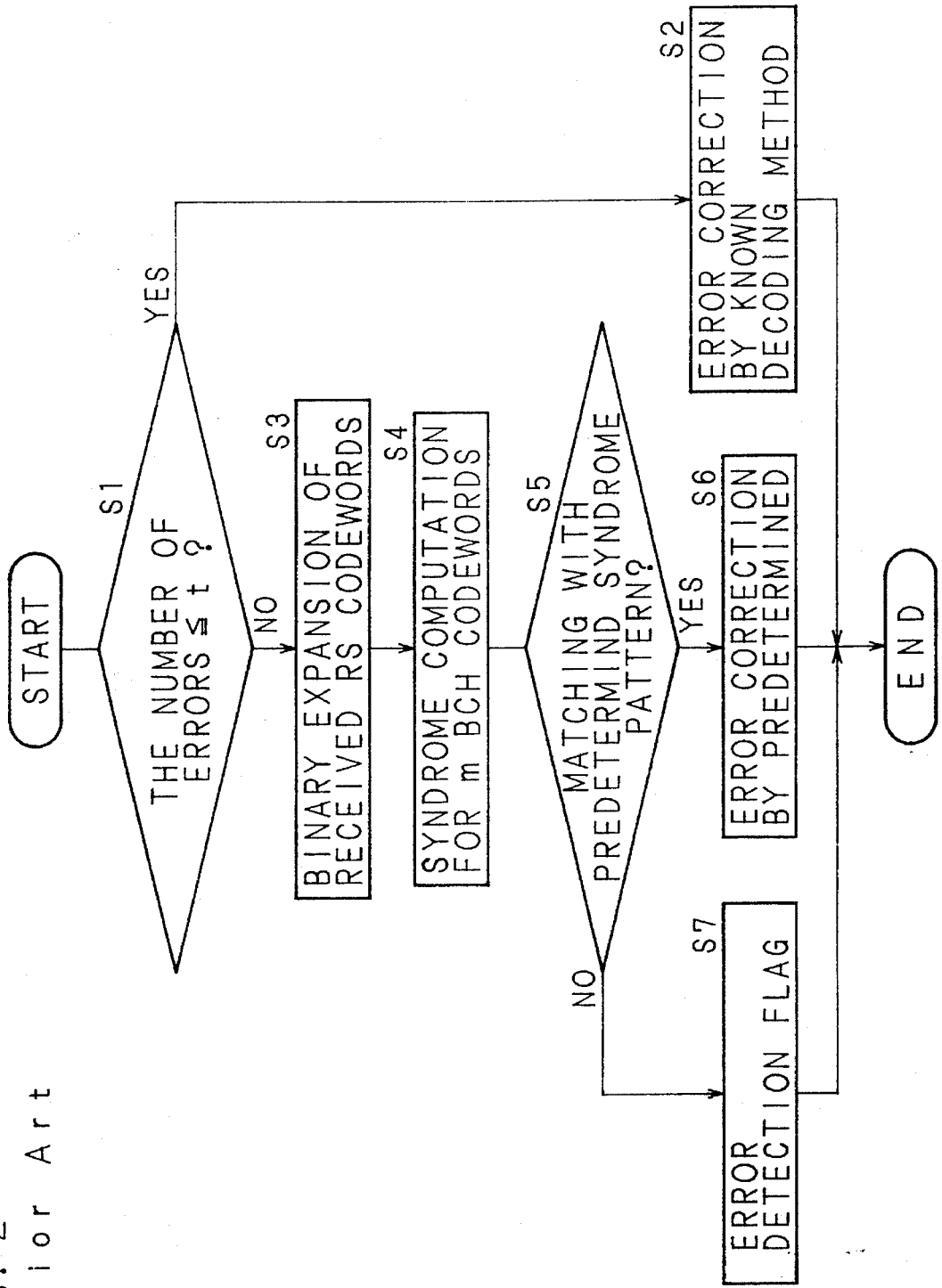
FIG. 2 is a flowchart illustrating a decoding procedure according to another prior art.
Figure 3:
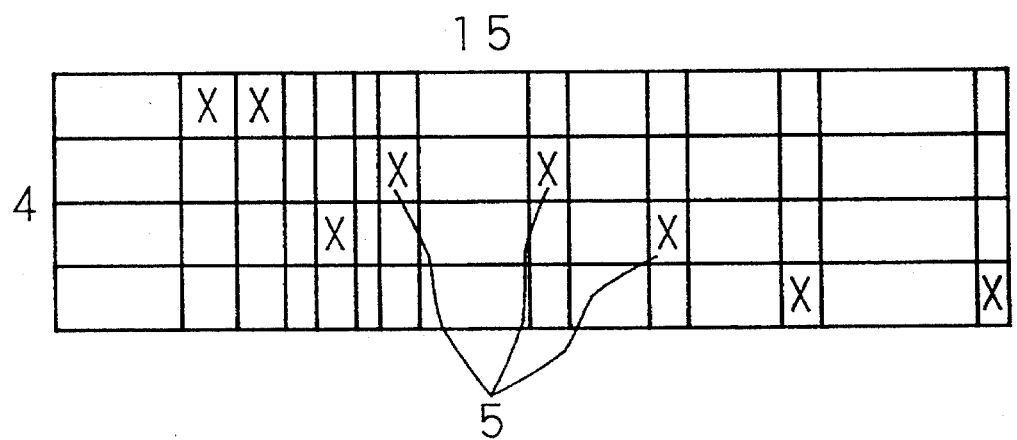
FIG. 3 is a diagram showing an example of an error pattern caused in a received codeword of a Reed-Solomon code.
Figure 4:
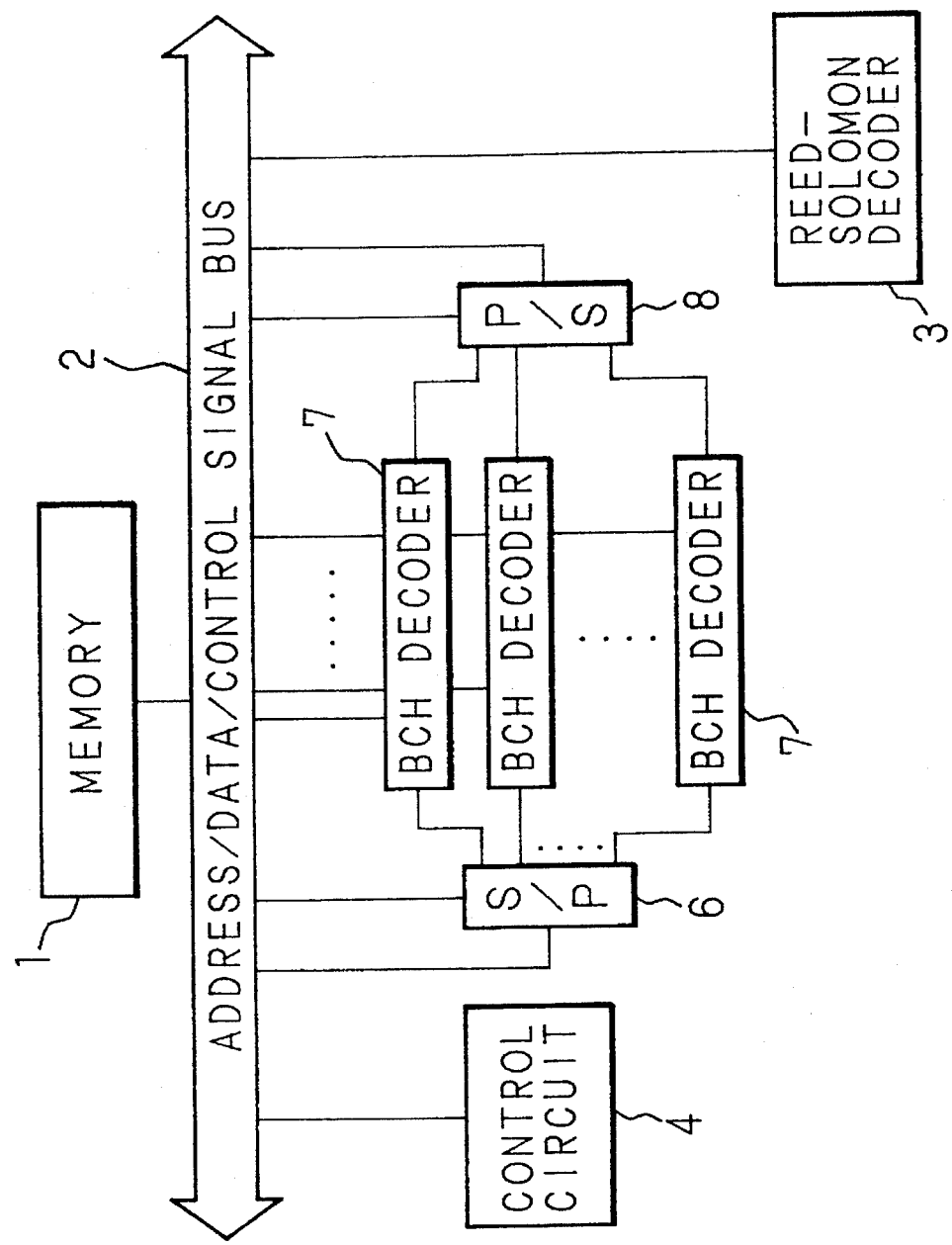
FIG. 4 is a circuit block diagram of a decoder according to one embodiment of the invention.

FIG. 4 is a diagram showing the configuration of a decoder according to one embodiment of the invention. In the figure, reference numerals 1, 2, 3, and 4 designate a memory, an address/data/control signal bus, a Reed-Solomon decoder, and a control circuit, respectively, which are the parts identical to or corresponding to those described in connection with the prior art. Further, the numeral 6 designates a serial/parallel format converter for serial-to-parallel converting the data supplied via the address/data/control signal bus 2, the numeral 7 indicates m BCH decoders for decoding m rows of binary BCH codes into which an (N, K, D) Reed-Solomon code is transformed, and the numeral 8 is a parallel/serial format converter for parallel-to-serial converting the outputs of the BCH decoders 7. As the Reed-Solomon code, a (15, 3, 13) code on GF ($2^4$) is considered.

In the illustrated example, BCH codes are input row by row into the respective BCH decoders 7 for correction of two errors for each code. Given that the generator polynomial for the BCH codewords is $$g^b(x) = g_1(x)g_3(x)$$
$$= (X^4 + X + 1)(X^4 + X^3 + X^2 + X + 1)$$

$\alpha$, $\alpha^2$, $\alpha^3$, and $\alpha^4$ are successive roots, and therefore, the minimum distance is 5, so that up to two errors can be corrected for each BCH code.

Now, if there are errors at positions i and j, the syndromes are $$S_1 = \alpha^i + \alpha^j$$

$$S_3 = \alpha^{3i} + \alpha^{3j}$$

$$S_3 = (\alpha^i + \alpha^j)^3 + \alpha^{2i}\alpha^j + \alpha^i\alpha^{2j}$$

$$= S_1^3 + \alpha^i\alpha^j(\alpha^i + \alpha^j)$$

$$\alpha^i\alpha^j = (S_3 + S_1^3)/S_1$$

The error position polynomial $\sigma(x)$ is $$\sigma(x) = X^2 + \sigma_1 X + \sigma_2$$

$$= (X + \alpha^i)(X + \alpha^j)$$

$$= X^2 + S_1 X + (S_3 + S_1^3)/S_1$$

Hence,
$\sigma_1 = S_1$
$\sigma_2 = (S_3 + S_1^3)/S_1$
Given that x=ay, $$\sigma_y(y) = y^2 + (\sigma_1/a)y + (\sigma_2/a^2)$$

Further, given that $a = \sigma_1$ $$\sigma_y(y) = y^2 + y + (\sigma_2/\sigma_1^2)$$

Thus, the roots $y_1$, $y_2$ are uniquely determined by the constant term $\sigma_2/\sigma_1^2$. Given the constant term, a ROM table lookup is performed to find $y_1$ and $y_2$, and the error positions are obtained by linear transformation $x=\sigma_1 y$. Error correction can thus be accomplished.

In FIG. 4, memory 1 stores a Reed-Solomon codeword in the form of m×N two-dimensional data consisting of m bits along a first direction and N bits along a second direction. Data read out of the memory 1 are fed via the address/data/control signal bus 2 to the serial/parallel format converter 6 from which the data are transferred to the BCH decoders 7 for BCH decoding. Here, N bits stored along the second directions are read out and converted by the serial/parallel format converter 6 into parallel data streams m bits long. The BCH-decoded words are passed through the parallel/serial format converter 8 and the Reed-Solomon decoder 3 inputs m-bits along the first direction to be Reed-Solomon decoded and output. The error position information used in the BCH decoding can also be utilized in the Reed-Solomon decoding.

Figure 5:
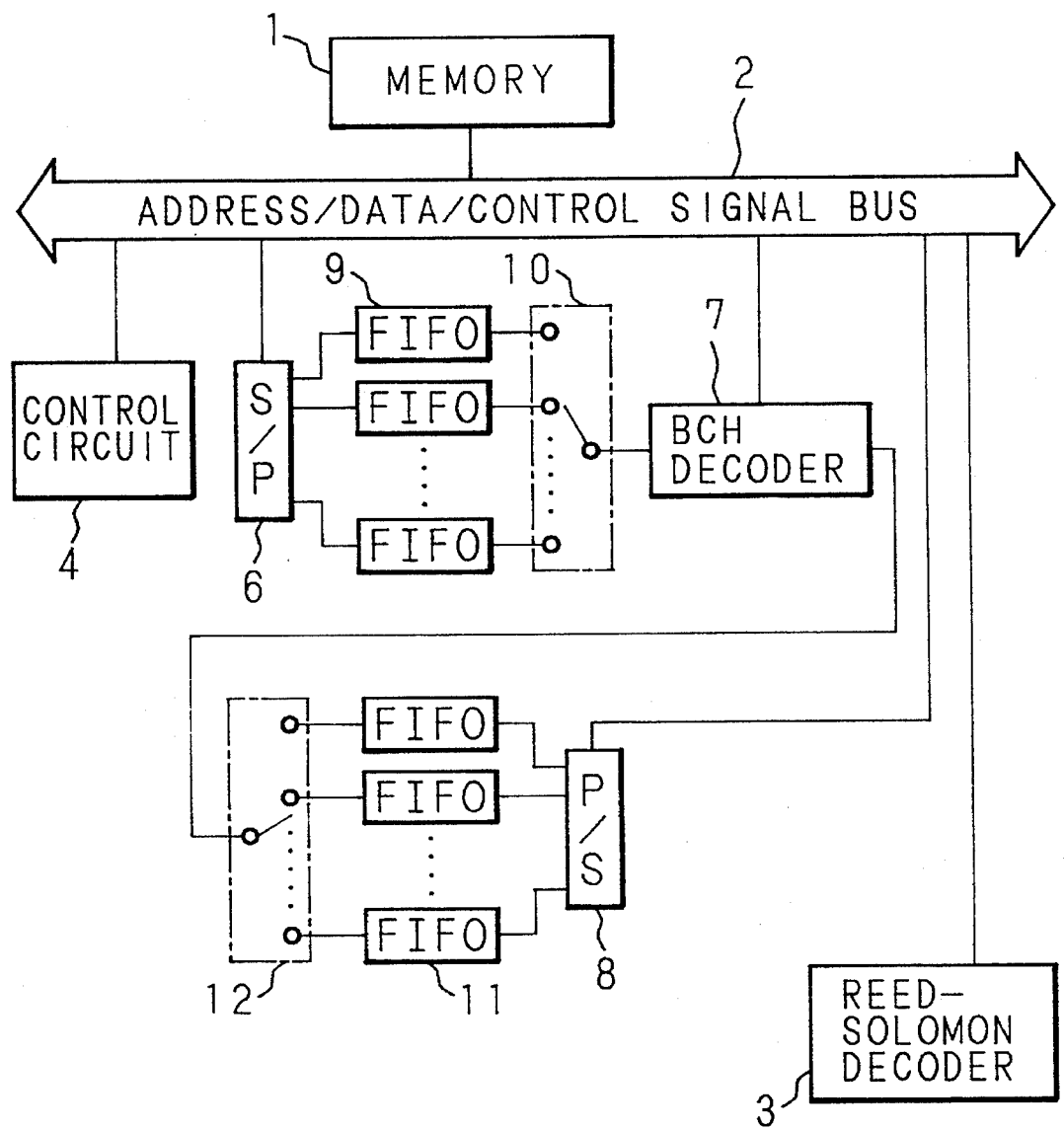
FIG. 5 is a circuit block diagram of a decoder according to another embodiment of the invention.

FIG. 5 is a circuit block diagram of a decoder according to another embodiment of the invention, wherein a single BCH decoder 7 is used to accomplish the purpose. In the figure, the reference numeral 9 designates m FIFO memories for storing data supplied from the serial/parallel format converter 6, the numeral 10 indicates a switch for selecting one of the outputs of the FIFO memories 9, the numeral 11 refers to m FIFO memories for storing the results of decoding, and the numeral 12 is a switch for directing the output to one of the FIFO memories 11.

A Reed-Solomon codeword having N m-bit symbols is stored as data. The serial/parallel converter serial-to-parallel converts m bits of the codeword to form parallel data streams N bits long, and the parallel data streams are stored into the FIFO memories 9 as BCH codewords. The received BCH codewords thus stored are transferred one by one via the switch 10 to the BCH decoder 7 for decoding, and the decoded words are sequentially fed to the FIFO memories 11. After decoding is performed m times by the BCH decoder 7, the decoded results are stored in sequence in the FIFO memories 11. The decoded results are then passed through the parallel/serial format converter 8 and input to the Reed-Solomon decoder 3 to be further decoded and output.

Figure 6:
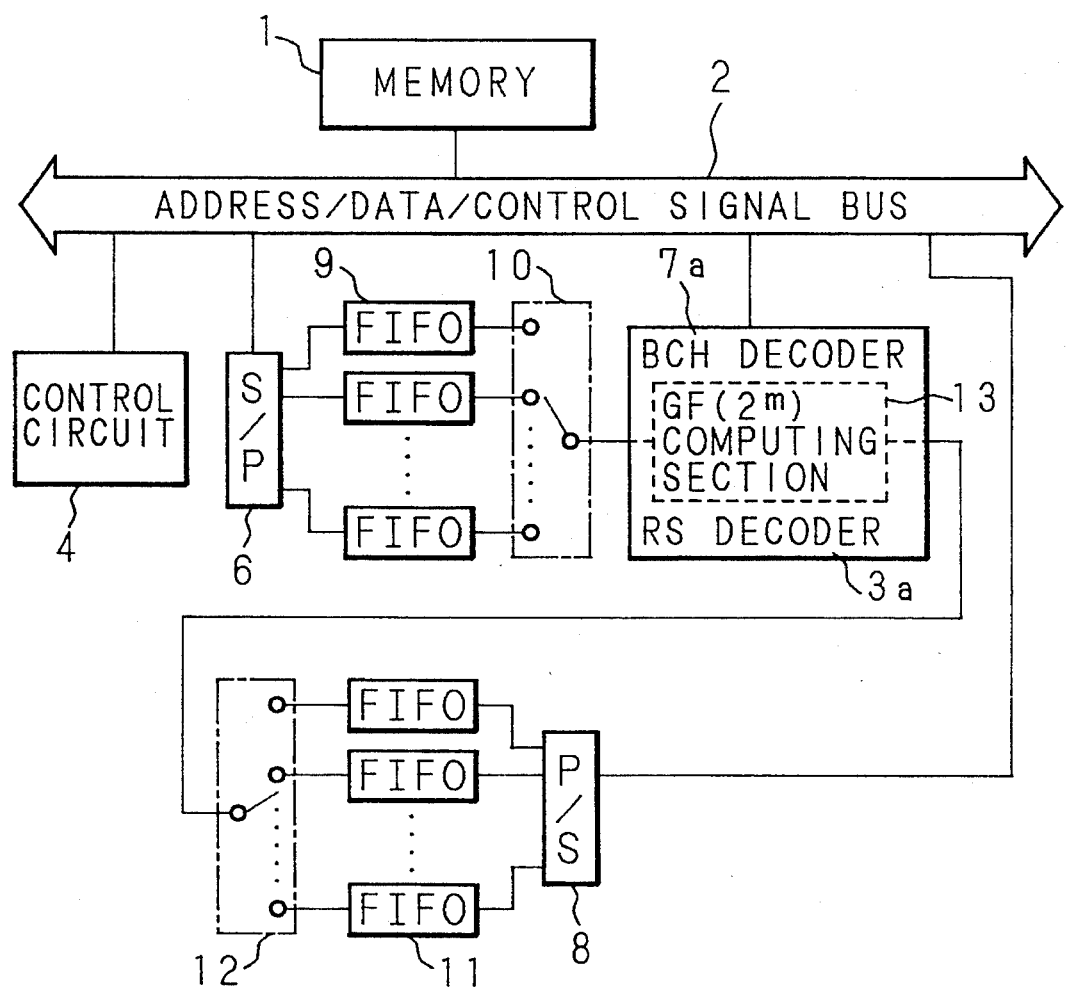
FIG. 6 is a circuit block diagram of a decoder according to a further embodiment of the invention.

FIG. 6 is a circuit block diagram showing a decoder according to another embodiment of the invention, wherein the BCH decoder and the Reed-Solomon decoder share portions of their operational circuits. That is, both the BCH and Reed-Solomon codes are defined by the same Galois field, so that the portion (GF computing section 13) for computing error positions from syndromes can be shared by the two decoders. For other purpose, the BCH decoder and the Reed-Solomon decoder have their own circuits. For example, a basis converter is unique to the BCH decoder 7a, while an error pattern computing circuit is unique to the Reed-Solomon decoder 3a.

Figure 7:
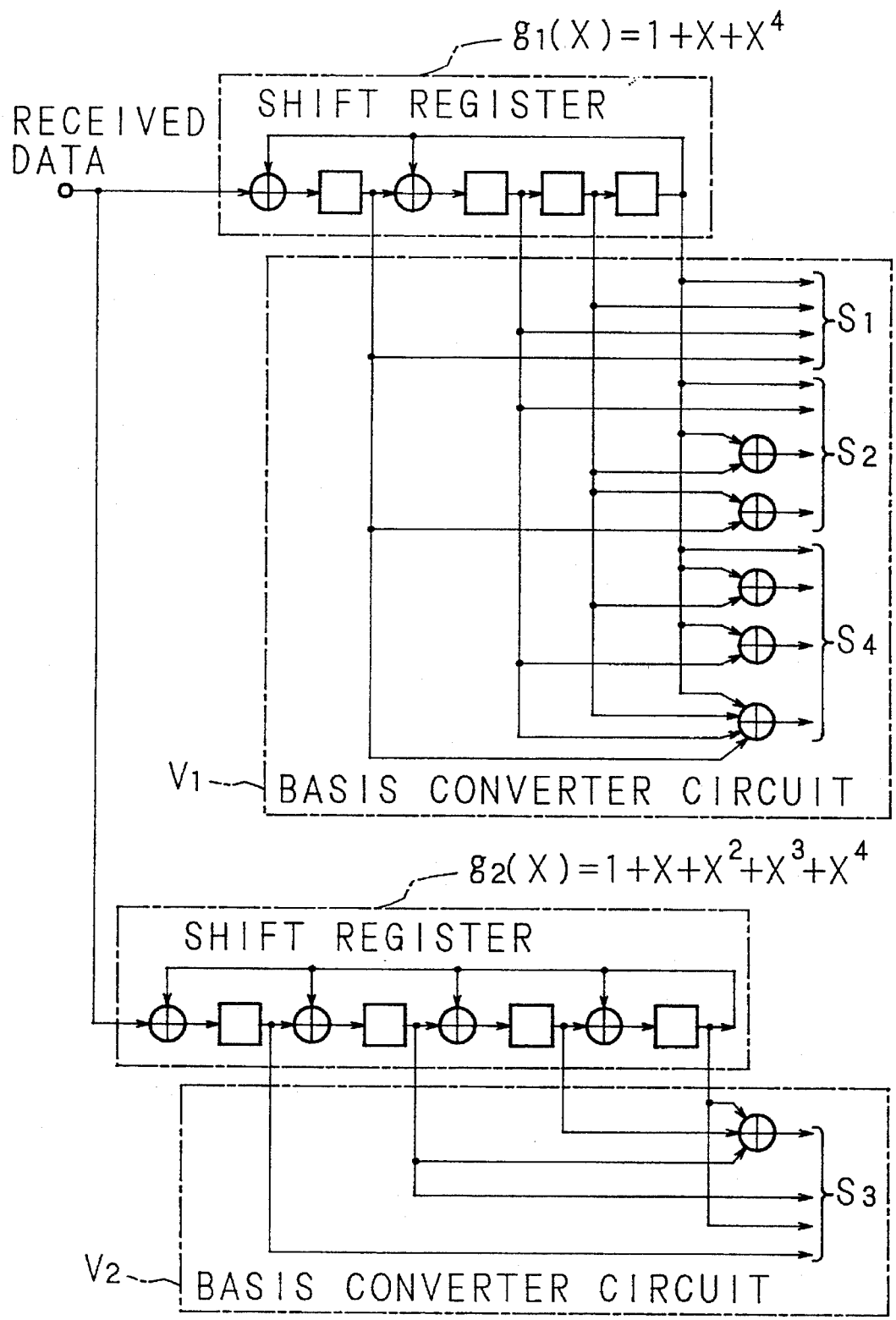
FIG. 7 is a circuit block diagram of a basis converter used in a BCH code decoder.

As an example, FIG. 7 shows a configuration of a basis converter for obtaining syndromes $S_1$, $S_2$, $S_3$, and $S_4$ from received codewords of a (15, 7, 5) BCH code, a binary code. FIG. 7 is constituted on the basis of FIGS. 6 and 11 in "Error Control Coding; Fundamentals and Applications" p. 168 by S. Lin & D. J. Costello, Jr., published by Prentice-Hall, 1983. Received data are input to a shift register $g_1$ forming a dividing circuit for dividing by $g_1(x)$, and also to a shift register $g_2$ forming a dividing circuit for dividing by $g_2(x)$, to obtain the results of the respective division operations. The division results from the shift registers $g_1$ and $g_2$ are converted by respective basis converter circuits $V_1$ and $V_2$ to vector representation on $GF(2^4)$.

Figure 8:
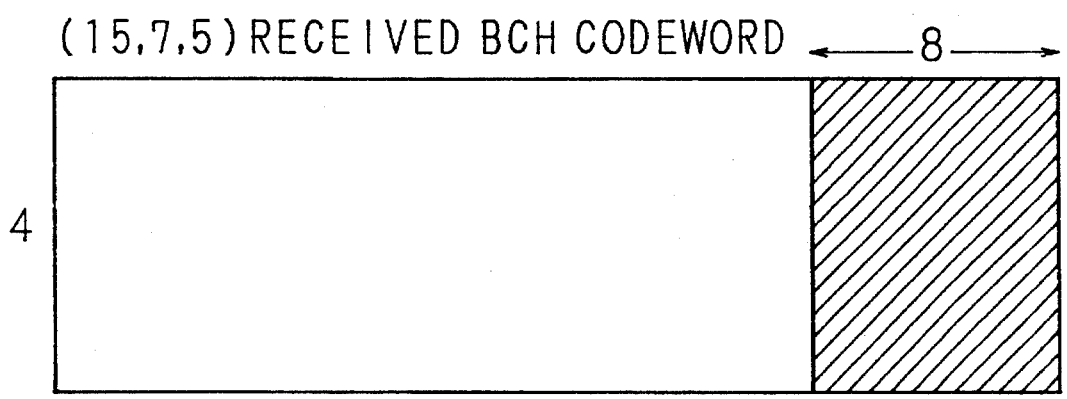
FIG. 8 is a diagram showing an example in which BCH codewords are arranged in an m×N array in a memory.

FIG. 8 is a diagram showing the received codewords of the (15, 7, 5) BCH code reconstructed in the four memories. That is, when applied to a system for transmitting and receiving (15, 7, 5) BCH codewards, the configuration of this embodiment enables the codewords to be decoded not only as received BCH codewords but also as received codewords of a (15, 7, 5) Reed-Solomon code which is a subcode of a (15, 11, 5) Reed-Solomon code on $GF(2^4)$.

Figure 9:
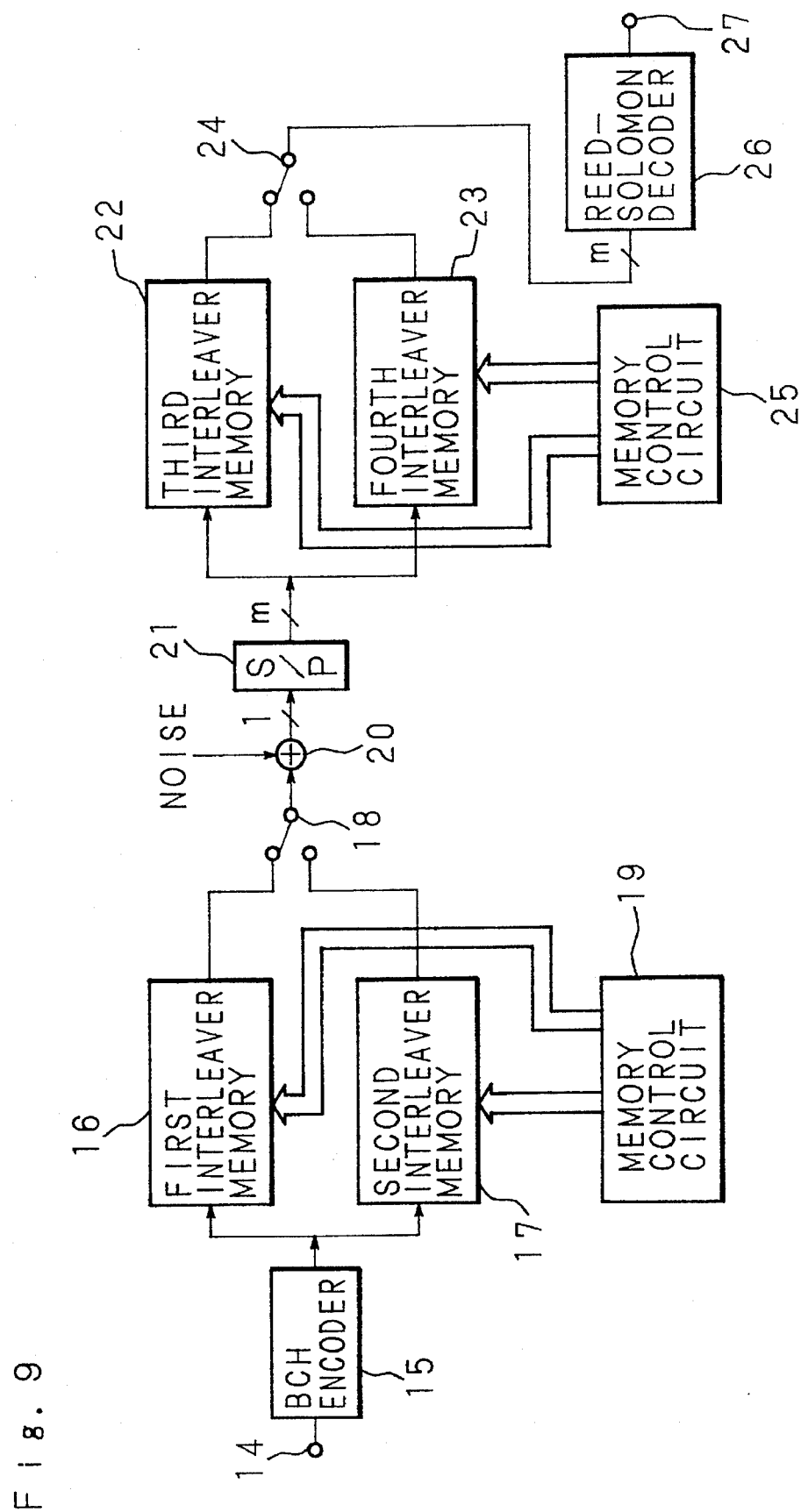
FIG. 9 is a circuit block diagram of a decoder according to still another embodiment of the invention.

FIG. 9 is a diagram showing the configuration of a decoder according to still another embodiment of the invention. In the figure, the reference numeral 14 is a data input terminal, 15 is a BCH encoder, 16 is a first interleaver memory, 17 is a second interleaver memory, 18 is a switch, 19 is a memory control circuit at the encoder side, 20 is a transmission channel (or recording/reproducing medium), 21 is a serial/parallel format converter, 22 is a third interleaver memory, 23 is a fourth interleaver memory, 24 is a switch, 25 is a memory control circuit at the decoder side, 26 is a Reed-Solomon decoder for a Reed-Solomon code, and 27 is an output terminal.

Data input via the input terminal 14 are encoded by the BCH encoder 15 and are stored alternately into the first interleaver memory 16 and the second interleaver memory 17. The memory control circuit 19 controls the memories 16 and 17 so that the data are written in the direction of the BCH code length N, sequentially constructing BCH codewords in m×L rows, and so that the stored data are read out in the unit of m×L bits in the direction perpendicular to the arranging direction of the BCH codewords and are transferred onto the transmission channel 20 via the switch 18. The switch 18 is always connected to the interleaver memory that is being read out.

At the receiver side, data containing noise caused by the transmission channel are received and passed to the serial/parallel format converter 21, which transfers the data in units of m bits to the third interleaver memory 22 or to the fourth interleaver memory 23. Each interleaver memory stores the data in units of L bytes (one byte having m bits), but it is read out in units of N bytes. The switch 24 is always operated to select the interleaver memory that is being read out, and the data are passed to the Reed-Solomon decoder 26 for error correction and are output through the output terminal 27.

Figure 10:
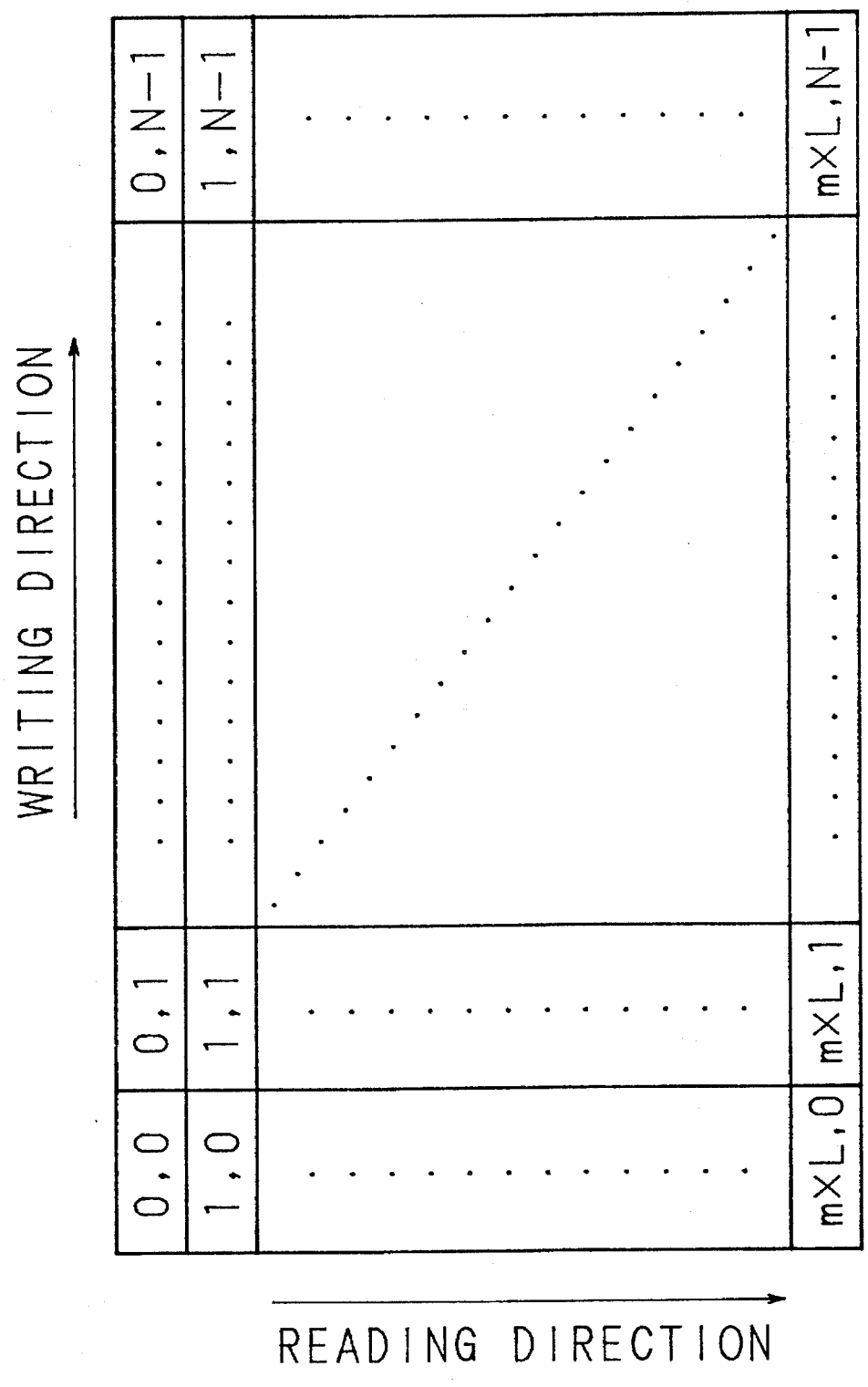
FIG. 10 is a diagram showing an example of data stored in a first and a second interleaver memory in FIG. 9.

The operation of each of the four interleaver memories will now be described in detail with reference to FIGS. 10 and 11. First, suppose that the first interleaver memory 16 has addresses assigned in an m×N two-dimensional array, each address being used to read and write one-bit data. After BCH encoding, data bits are written in the horizontal direction shown in FIG. 10. That is, the first N-bit data is written starting at address (0, 0) and ending at address (0, N–1). In the (x, y) notation used herein, x denotes the address along the vertical direction, and y denotes the address along the horizontal direction. The next BCH code-word is written starting at (1, 0) and ending at (1, N–1), and so on, until the last BCH codeword is written starting at (m×L, 0) and ending at (m×L, N–1), thus completing the writing to the first interleaver memory 16. During this writing operation, data stored in the second interleaver memory 17 are read out. When the writing to the first interleaver memory 16 is completed, the memory control circuit 19 performs control so as to start writing BCH codewords to the second interleaver memory 17, while on the other hand, the data stored in the first interleaver memory 16 are read out and output onto the transmission channel 20 via the switch 18. In the reading operation, the data are read out column-wise in units of m×L bits, first working in the sequence of (0, 0), (1, 0) . . . (m×L, 0), then in the sequence of (0, 1), (1, 1) . . . (m×L, 1), and so on. The data bits thus read out are output onto the transmission channel 20.

At the receiver side, the third interleaver memory 22 or the fourth interleaver memory 23, whichever is selected, stores the data bits column-wise, as shown in FIG. 11, starting with the first column in the sequence of (0, 0), (1, 0) . . . (m×L, 0), then the next column in the sequence of (0, 1), (1, 1) . . . (m×L, 1), and so on, until all the N columns are written in. While one interleaver memory 22 or 23 is being written to, data stored in the other interleaver memory 23 or 22 are read out. When the writing to the one interleaver memory 22 or 23 is completed, the memory control circuit 25 switches between the reading and writing modes so that the data stored in either interleaver memory 22 or 23 are now read out. At the receiver side, the data are read out as received Reed-Solomon codewords. That is, the data bits are read out in parallel in blocks of m bits, first from the block of (0, 0), (1, 0) . . . (m, 0), then from the block of (0, 1), (1, 1) . . . (m, 1), next from the block of (0, 2), (1, 2) . . . (m, 2), and so on, until the final block of (0, N–1), (1, N–1) . . . (m, N–1) is read out. The first received Reed-Solomon codeword is thus output. After that, blocks of m bits are sequentially read out, starting with the block of (m+1, 0), (m+2, 0) . . . (2m, 0), to output the next received Reed-Solomon codeword. The same operation is repeated until the last Lth received Reed-Solomon codeword of m×N bits is output to complete the reading in either interleaver memory 22 or 23. In this manner, the bits and symbols are smoothly transformed between the BCH and Reed-Solomon codewords.

Suppose now that the generator polynomial for the BCH code is $$g^b(x) = g_1(x)g_3(x)$$
$$= (X^4 + X + 1)(X^4 + X^3 + X^2 + X + 1)$$

Then, $\alpha$, $\alpha^2$, $\alpha^3$, and $\alpha^4$ are successive roots, and therefore, the minimum distance is 5, so that up to two errors can be corrected for each BCH codeword. In this case, the code length is 15, the number of information symbols is 7, and the number of check symbols is 8.

Here, let us consider the following generator polynomial on GF $(2^4)$.

$$G(x)=(X-\alpha)(X-\alpha^2)(X-\alpha^3)(X-\alpha^4)$$

This also has successive roots $\alpha$, $\alpha^2$, $\alpha^3$, and $\alpha^4$, and therefore, the minimum distance of the Reed-Solomon code is also 5, which means that up to two errors can be corrected. However, the difference from the BCH code is that the Reed-Solomon code can correct two errors in blocks of 4 bits. The parameter is given as the (15, 7, 5) Reed-Solomon code of GF($2^4$). This is a subcode of the (15, 11, 5) Reed-Solomon code.

Figure 12:
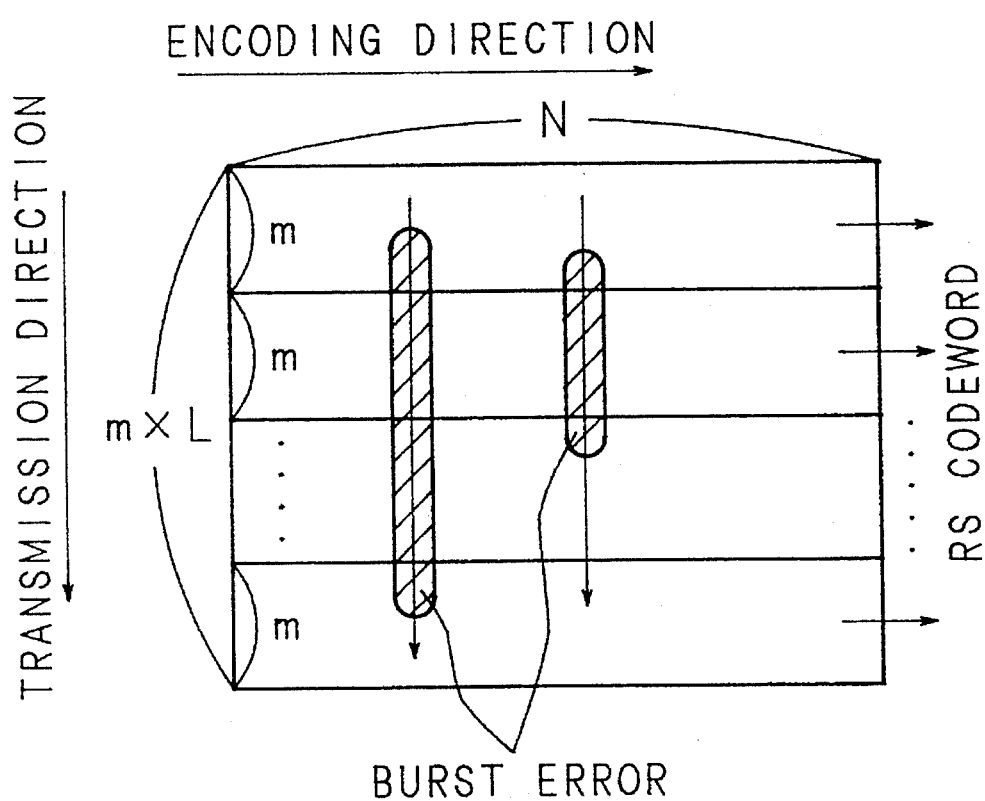
FIG. 12 is a diagram showing an example of error patterns caused in received codewords of a Reed-Solomon code.

Now, let us consider a decoder primarily designed for burst error correction. If very long burst errors are spread out in the transmission direction, as shown in FIG. 12, and if these errors are corrected in orthogonal direction, the errors are correctable since they can be handled as random errors. Since the received data are decoded as received Reed-Solomon codewords in units of m×N (4×15 in the above example), the decoding speed is faster compared to the decoding of BCH codewords which is performed in units of N. Assuming that the length of N unit in the encoding direction shown in FIG. 12 is the same between the BCH and Reed-Solomon codes (in reality, the Reed-Solomon code is slightly longer), the Reed-Solomon decoding time will be shortened to about 1/m of the BCH decoding time. Therefore, in this embodiment, the decoding time can, in some cases, be shortened to nearly ¼.

Now, suppose that there are errors at positions i and j. Then, the syndromes for the Reed-Solomon code are $$S_1=e_i\alpha^i+e_j\alpha^j$$
$$S_2=e_i\alpha^{2i}+e_j\alpha^{2j}$$
$$S_3=e_i\alpha^{3i}+e_j\alpha^{3j}$$
$$S_4=e_i\alpha^{4i}=e_j\alpha^{4j}$$

The equations are solved for the unknowns $e_i$, $e_j$, $\alpha^i$, and $\alpha^j$, to correct the errors. Data are Reed-Solomon decoded for output.

Figure 13:
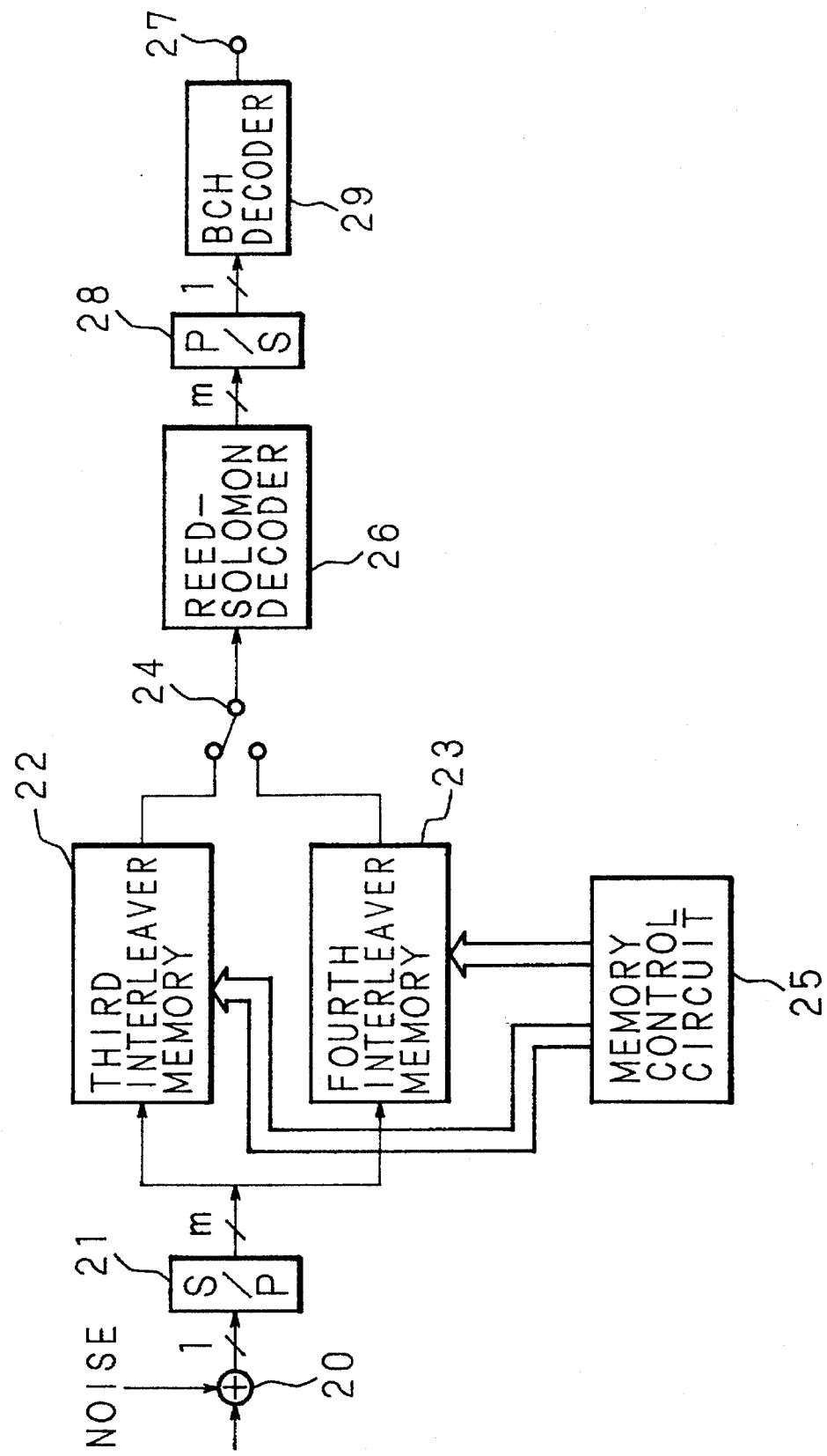
FIG. 13 is a circuit block diagram of a decoder according to a still further embodiment of the invention.

FIG. 13 is a diagram showing the configuration of a still further embodiment of the invention, wherein the Reed-Solomon decoding is followed by BCH decoding. In the figure, the reference numeral 28 designates a parallel/serial format converter for performing parallel-to-serial conversion on the output of the Reed-Solomon decoder 26, and the numeral 29 denotes a BCH decoder for BCH-decoding the output of the parallel/serial format converter 28. When there are uncorrectable errors after the Reed-Solomon decoding, such errors may be corrected by decoding data as BCH codes. For example, suppose that the errors are mostly random errors, with two errors in the BCH codeword in each row.

Here, suppose that there are errors at positions i and j, the syndromes are $$S_1 = \alpha^i + \alpha^j$$

$$S_3 = \alpha^{3i} + \alpha^{3j}$$

$$S_3 = (\alpha^i + \alpha^j)^3 + \alpha^{2i}\alpha^j + \alpha^i\alpha^{2j}$$
$$= S_1^3 + \alpha^i\alpha^j(\alpha^i + \alpha^j)$$

$$\alpha^i\alpha^j = (S_3 + S_1^3)/S_1$$

The error position polynomial $\sigma(x)$ is $$\sigma(x) = X^2 + \sigma_1 X + \sigma_2$$
$$= (X + \alpha^i)(X + \alpha^j)$$
$$= X^2 + S_1 X + (S_3 + S_1^3)/S_1$$

Hence,
$\sigma_1 = S_1$
$\sigma_2 = (S_3 + S_1^3)/S_1$
Given that x=ay, $$\sigma_y(y) = y^2 + (\sigma_1/a)y + (\sigma_2/a^2)$$

Further, $\sigma$ given that $a = \sigma_1$ $$\sigma_y(y) = y^2 + y + (\sigma_2/\sigma_1^2)$$

Thus, the roots $y_1$, $y_2$ are uniquely determined by the constant term $\sigma_2/\sigma_1^2$. Given the constant term, a ROM table lookup is performed to find $y_1$ and $y_2$, and the error positions are obtained by linear transformation $x = \sigma_1 y$. Error correction can thus be accomplished. That is, since the errors that cannot be corrected by the Reed-Solomon code are mostly random noise, such errors may be corrected by decoding the received data as BCH codewords.

Figure 14:
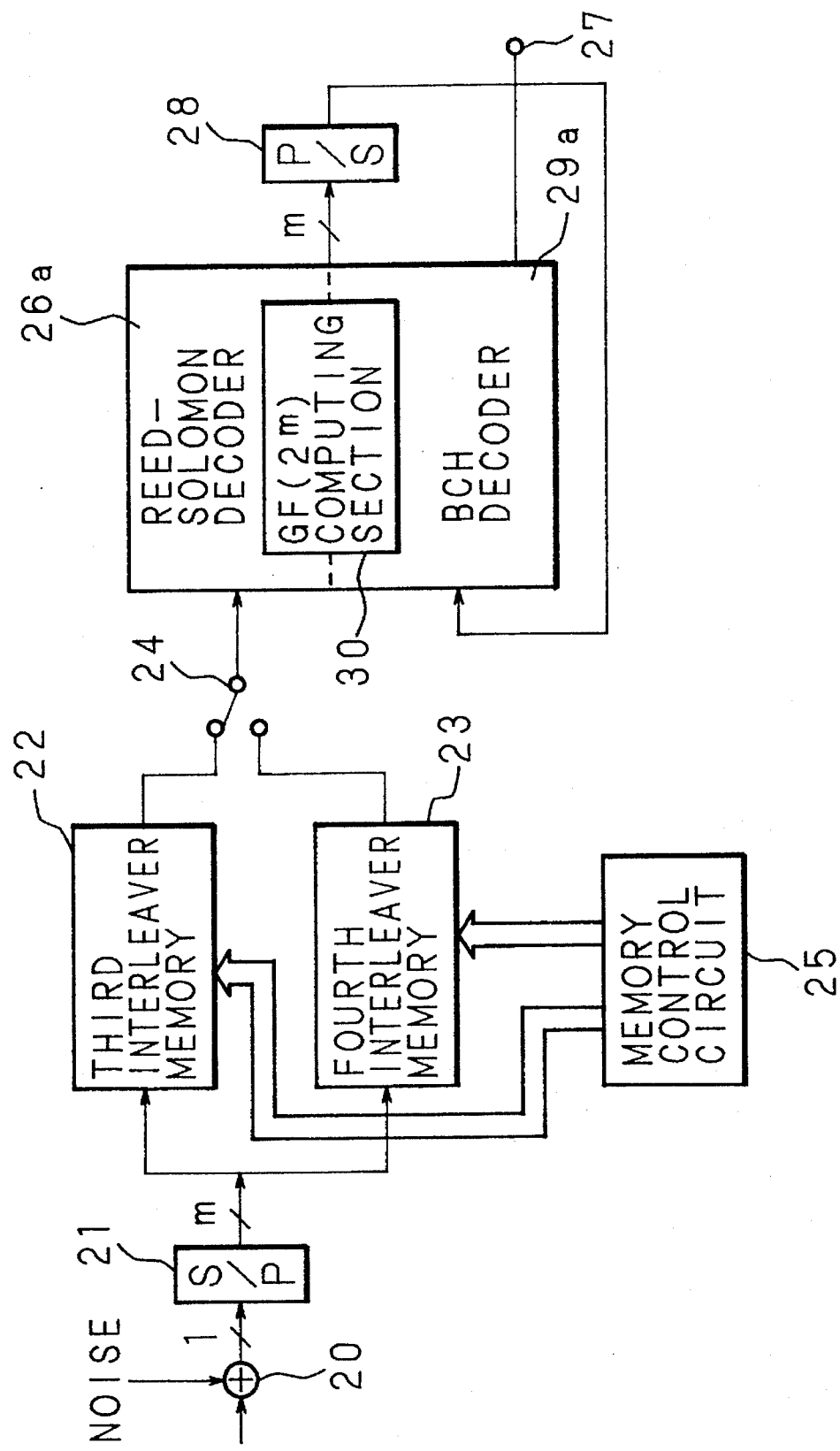
FIG. 14 is a circuit block diagram of a decoder according to a yet further embodiment of the invention.

FIG. 14 is a diagram showing the configuration of a yet further embodiment of the invention, wherein a BCH decoder 29a and a Reed-Solomon decoder 26a share portions of their respective circuits. That is, when both the BCH and Reed-Solomon codes are defined by the same Galois field, the two decoders can share the same GF computing section 30. For other purpose, the BCH decoder and the Reed-Solomon decoder have their own circuits. For example, there is provided a base converter which is unique to the BCH decoder 29a, while an error pattern computing circuit is provided which is unique to the Reed-Solomon decoder 26a.

The above embodiments have been described by taking the Galois field $GF(2^4)$ as an example, but it will be appreciated that the invention is also applicable to codes constructed from other Galois fields such as $GF(2^3)$.

As described, according to the invention, each Reed-Solomon codeword having m-bit symbols is transformed into m BCH codewords each having binary symbols for correction of errors in each BCH codeword. Therefore, random errors, if spread out, can be corrected efficiently. Furthermore, since received BCH words can also be decoded as received Reed-Solomon codewords for further error correction, errors can be corrected efficiently.

Further, according to the invention, BCH codewords are stored in an interleaver buffer memory which arranges the BCH codewords in m×L rows, and error correction is performed by decoding them as Reed-Solomon codewords each having m-bit symbols. Thus, burst errors are spread out so that the errors can be corrected efficiently. Furthermore, since the received data can also be decoded as BCH codewords for further error correction, the errors that cannot be corrected as the Reed-Solomon code can be corrected efficiently.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A decoder comprising:

decoding means for receiving data, encoded using a single code, and, operating on a Galois field $GF(2^m)$, for decoding said data as an (N, K, D) Reed-Solomon code, where N denotes code length, K denotes a number of information symbols, D denotes a minimum distance of a code, and m is an integer; and decoding means for receiving said data, and, operating on the same Galois field $GF(2^m)$, for decoding said data as an (N, k, d) BCH code, where N denotes code length, k denotes a number of information symbols, and d denotes a minimum distance of a code, each information symbol of the BCH code having a different number of bits than each information symbol of the Reed-Solomon code, wherein said two decoding means share a computing section for computing error positions.

2. A decoder for decoding an (N, K, D) Reed-Solomon code defined on a Galois field $GF(2^m)$ and consisting of m-bit symbols arranged in a memory with m-bit depth, where N denotes code length, K denotes a number of information symbols, D denotes a minimum distance of a code, and m is an integer greater than one, comprising:

means for transforming a received Reed-Solomon codeword into m received BCH codewords, each information symbol in each of the m received BCH codewords having a different number of bits than each information symbol in the received Reed-Solomon codeword;

means for correcting errors by decoding each of the m received BCH codewords; and means for Reed-Solomon decoding after error correction by BCH decoding.

3. An error correcting method comprising the steps of:

(a) storing a Reed-Solomon codeword as data in a memory;

(b) serial-to-parallel converting said data to obtain a number of parallel data streams, each information symbol in each of the parallel data streams having a different number of bits than each information symbol in the Reed-Solomon codeword stored in step (a);

(c) BCH decoding each parallel data stream;

(d) parallel-to-serial converting the output of said step (c); and (e) Reed-Solomon decoding the output of said step (d).

4. The method of claim 3, wherein said step (a) stores said data in the form of m×N two dimensional data consisting of m bits along a first direction and N bits along a second direction.

5. The method of claim 4, wherein said step (b) converts said N bits along said second direction into said number of parallel data streams, each parallel data stream being m bits long;

said step (c) BCH decodes each parallel data stream using said number of BCH decoders, each BCH decoder corresponding to a parallel data stream;

said step (d) includes the steps of,
(d1) parallel-to-serial converting output from said BCH decoders, and
(d2) storing said output of said step (d1) in said memory; and said step (e) includes the step of,
(e1) reading m bits along said first direction from said memory, and
(e2) Reed-Solomon decoding output from said step (e1).

6. The method of claim 5, wherein said step (e2) decodes said output from said step (e1) as a Reed-Solomon code having a length of N symbols on a Galois field $GF(2^m)$.

7. The method of claim 3, wherein
said step (a) stores a Reed-Solomon codeword having N m-bit symbols as said data; and
said step (b) serial-to-parallel converts m bits of said Reed-Solomon codeword into said number of parallel data streams, each data stream being N bits long.

8. The method of claim 7, further comprising:
(f) storing each of said parallel data streams in a secondary memory;
(g) successively selecting one of said secondary memories using a switch; wherein
said step (c) BCH decodes said parallel data stream stored in said selected one of secondary memories;
(i) storing each BCH decoded parallel data stream in a tertiary memory; and wherein
said step (d) parallel-to-serial converts said BCH decoded parallel data streams stored in said tertiary memories.

9. An error correcting method comprising the steps of:
(a) serial-to-parallel converting BCH codewords into m-bit parallel data streams;
(b) storing L parallel data streams as a column in an interleaver memory, wherein L is an integer multiple of m;
(c) repeating step (b) to store N columns within said interleaver memory;
(d) reading m rows from each of said N columns;
(e) Reed-Solomon decoding each m-bit block output in said step (d), wherein each information symbol in each m-bit block have a different number of bits than each information symbol in the BCH codewords.

10. The method of claim 9, further comprising the steps of:
(f) repeating steps (a), (b) and (c) for a second interleaver memory when performing steps (d) and (e) with respect to said first interleaver memory.

11. The method of claim 9, wherein
said step (a) serial-to-parallel converts BCH codewords of an N,k,d) BCH code on a Galois field GF(2) where N denotes code length, k denotes a number of information symbols, and d denotes a minimum distance of a code; and
said step (e) Reed-Solomon decodes said output of said step (d) as codewords of a Reed-Solomon code on a Galois field $GF(2^m)$.

12. The method of claim 9, further comprising the steps of:
(e) parallel-to-serial converting output of said step (d); and (f) BCH decoding output of said step (e).

13. An error correcting apparatus comprising:
a memory storing a Reed-Solomon codeword as data;
a serial-to-parallel converter serial-to-parallel converting said data to obtain a number of parallel data streams, each information symbol in each of the parallel data streams having a different number of bits than each information symbol in the Reed-Solomon codeword;
at least one BCH decoder BCH decoding said parallel data streams;
a parallel-to-serial converter parallel-to-serial converting said BCH decoded parallel data streams; and
a Reed-Solomon decoder Reed-Solomon decoding the output of said parallel-to-serial converter.

14. The apparatus of claim 13, wherein said memory stores said data in the form of m×N two dimensional data consisting of m bits along a first direction and N bits along a second direction.

15. The apparatus of claim 14, wherein
said serial-to-parallel converter converts said N bits along said second direction into said number of parallel data streams, each parallel data stream being m bits long;
a BCH decoder corresponds to each parallel data stream and BCH decodes its corresponding parallel data stream;
said parallel-to-serial converter converts output from said BCH decoders, and
said memory stores said output from said parallel-to-serial converter; and
said Reed-Solomon decoder reads m-bit blocks of data along said first direction from said memory, and Reed-Solomon decodes said read data.

16. The apparatus of claim 15, wherein said Reed-Solomon decoder decodes said read data as a Reed-Solomon code having a length of N symbols on a Galois field $GF(2^m)$.

17. The apparatus of claim 13, wherein
said memory stores a Reed-Solomon codeword having N m-bit symbols as said data; and
said serial-to-parallel converter converts m bits of said Reed-Solomon codeword into said number of parallel data streams, each data stream being N bits long.

18. The apparatus of claim 17, further comprising:
a plurality of first FIFO memories, each FIFO memory corresponding to a parallel data stream and storing a corresponding parallel data stream;
a first switch successively selecting one of said first FIFO memories; wherein
a single BCH decoder BCH decodes a parallel data stream stored in said selected one of said first FIFO memories;
a plurality of second FIFO memories, each FIFO memory corresponding to a parallel data stream
a second switch successively selecting one of said second FIFO memories; wherein
said selected second FIFO memory stores output of said BCH decoder; and
said parallel-to-serial converter converts said BCH decoded parallel data streams stored in said second FIFO memories.

19. The apparatus of claim 13, wherein said BCH decoder and said Reed-Solomon decoder share operational circuit portions.

20. An error correcting apparatus comprising:
a serial-to-parallel converter serial-to-parallel converting BCH codewords into m-bit parallel data streams;

an interleaver memory storing L parallel data streams as a column, wherein L is an integer multiple of m and greater than m, and storing N of said columns;

a Reed-Solomon decoder reading, as data, m rows from each of said columns, and Reed-Solomon decoding each m-bit block, wherein each information symbol in each m-bit block have a different number of bits than each information symbol in the BCH codewords.

21. The apparatus of claim 20, further comprising:

a second interleaver memory storing L parallel data streams as a column, wherein L is an integer multiple of m, and storing N of said columns; and a memory control circuit controlling said first and second interleaver memory so that when said Reed-Solomon decoder reads from one of said first and second interleaver memory, only the other one of said first and second interleaver memory stores said parallel data streams.

22. The apparatus of claim 20, wherein said serial-to-parallel converter converts BCH codewords of an (N,k,d) BCH code on a Galois field GF (2) where N denotes code length, k denotes a number of information symbols, and d denotes a minimum distance of a code; and said Reed-Solomon decoder decodes said read data as codewords of a Reed-Solomon code on a Galois field GF ($2^m$).

23. The apparatus of claim 20, further comprising:

a parallel-to-serial converter parallel-to-serial converting output from said Reed-Solomon decoder; and a second BCH decoder BCH decoding output of said parallel-to-serial converter.

24. The apparatus of claim 20, wherein said BCH decoder and said Reed-Solomon decoder share operational circuit portions.

* * * * *